United States Patent
Shinohara et al.

(10) Patent No.: US 8,436,396 B2
(45) Date of Patent: May 7, 2013

(54) SEMICONDUCTOR LIGHT EMITTING ELEMENT, METHOD FOR MANUFACTURING SEMICONDUCTOR LIGHT EMITTING ELEMENT, AND LAMP

(75) Inventors: Hironao Shinohara, Ichihara (JP); Naoki Fukunaga, Munakata (JP)

(73) Assignee: Toyoda Gosei Co., Ltd., Aichi (JP)

( * ) Notice: Subject to any disclaimer, the term of this patent is extended or adjusted under 35 U.S.C. 154(b) by 203 days.

(21) Appl. No.: 12/993,733

(22) PCT Filed: May 20, 2009

(86) PCT No.: PCT/JP2009/059286
§ 371 (c)(1),
(2), (4) Date: Nov. 19, 2010

(87) PCT Pub. No.: WO2009/142246
PCT Pub. Date: Nov. 26, 2009

(65) Prior Publication Data
US 2011/0068349 A1    Mar. 24, 2011

(30) Foreign Application Priority Data
May 20, 2008    (JP) .................................. 2008-131882

(51) Int. Cl.
*H01L 33/00*    (2010.01)
*H01L 29/00*    (2006.01)

(52) U.S. Cl.
USPC .... 257/102; 257/103; 257/432; 257/E33.012; 257/E33.064; 438/29

(58) Field of Classification Search .................. None
See application file for complete search history.

(56) References Cited

U.S. PATENT DOCUMENTS

| 6,153,894 A * | 11/2000 | Udagawa ........................ 257/96 |
| 2003/0122147 A1* | 7/2003 | Sheu .............................. 257/103 |
| 2005/0236630 A1* | 10/2005 | Wang .............................. 257/80 |
| 2008/0210958 A1* | 9/2008 | Senda et al. .................... 257/89 |
| 2010/0213501 A1 | 8/2010 | Kamei |

FOREIGN PATENT DOCUMENTS

| CN | 1611631 A | 5/2005 |
| CN | 1316057 C | 5/2007 |
| JP | 2005-244128 A | 9/2005 |

(Continued)

OTHER PUBLICATIONS

Chinese Office Action dated Sep. 25, 2012 for corresponding Chinese Patent Application No. 200980118007.0.

*Primary Examiner* — Alonzo Chambliss
(74) *Attorney, Agent, or Firm* — Sughrue Mion, PLLC

(57) ABSTRACT

A semiconductor light-emitting device (1) of the present invention includes a substrate (101); a laminate semiconductor layer (20) formed by sequentially laminating an n-type semiconductor layer (104), a light-emitting layer (105), and a p-type semiconductor layer (106) on the substrate (101); and a translucent electrode layer (109) formed on a top surface (106*a*) of the p-type semiconductor layer (106), wherein the translucent electrode layer (109) contains a dopant element, a content of the dopant element within the translucent electrode layer (109) decreases gradually toward the interface (109*a*) between the p-type semiconductor layer (106) and the translucent electrode layer (109), and in the translucent electrode layer (109) is formed a diffusion region in which an element constituting the p-type semiconductor layer (106) is diffused from the interface (109*a*) toward the inside of the translucent electrode layer (109).

13 Claims, 7 Drawing Sheets

FOREIGN PATENT DOCUMENTS

| | | |
|---|---|---|
| JP | 2007-73690 A | 3/2007 |
| JP | 2007-142028 A | 6/2007 |
| JP | 2007-194401 A | 8/2007 |
| WO | 2007/119830 A1 | 10/2007 |

* cited by examiner

SEMICONDUCTOR LIGHT EMITTING ELEMENT, METHOD FOR MANUFACTURING SEMICONDUCTOR LIGHT EMITTING ELEMENT, AND LAMP

TECHNICAL FIELD

The present invention relates to a semiconductor light-emitting device, a method for manufacturing the same, and a lamp, and more particularly to a semiconductor light-emitting device with a low driving voltage (Vf), a method for manufacturing the same, and a lamp.

Priority is claimed on Japanese Patent Application No. 2008-131882, filed on May 20, 2008, the content of which is incorporated herein by reference.

BACKGROUND ART

In recent years, GaN-based compound semiconductor materials have become of interest as a semiconductor material for a light-emitting device that emits light of short wavelength. A GaN-based compound semiconductor is formed on a substrate of a sapphire single crystal, various oxides, or a Group III-V compound, through thin-film forming means such as a metal-organic chemical vapor deposition method (MOCVD method), a molecular-beam epitaxy method (MBE method) or the like.

A GaN-based compound semiconductor thin film has a characteristic such as less diffusion of a current in an in-plane direction of the thin film. Furthermore, a p-type GaN-based compound semiconductor has a characteristic such as higher resistivity than that of an n-type GaN-based compound semiconductor. Therefore, current spreading in an in-plane direction of the p-type semiconductor layer scarcely arises only by laminating a p-type electrode made of metal on the surface of the p-type semiconductor layer. Accordingly, there is such a characteristic that, when a laminate semiconductor layer having a LED structure made of an n-type semiconductor layer, a light-emitting layer and a p-type semiconductor layer is formed and a p-type electrode is formed on the p-type semiconductor layer as the top portion, only the portion located directly under the p-type electrode of the light-emitting layer emits light.

Therefore, in order to extract light emitted directly under the p-type electrode out of the light-emitting device, it is necessary to impart translucency to the p-type electrode. There is a method which uses a conductive translucent material such as ITO as the translucent p-type electrode (see Patent Literature 1).

Moreover, it is disclosed that the semiconductor metal mixed layer, which contains Ga of a Group III metal component in the vicinity of the p-type semiconductor side of the transparent conductive film, exists in the light-emitting layer where the positive electrode comprised of the transparent conductive film is in contact with the p-type semiconductor layer, and that in the p-type semiconductor exists the positive electrode metal mixed layer of the region in which In and Sn from the transparent conductive film are detected (see Patent Literature 2). In other words, Patent Literature 2 discloses that a sputtering film formation method with RF discharge is preferably used for the formation of the transparent conductive film on the p-type semiconductor layer. Moreover, Patent Literature 2 discloses that in the sputtering film formation method with RF discharge the function which provides energy to the sputtered atom attached to the p-type semiconductor layer by the ion assist effect and enhances the surface diffusion between the sputtered atom and the p-type semiconductor. In addition, Patent Literature 2 discloses that when the surface of the GaN layer is exposed to plasma in the sputtering of the metal oxide, the plasma particles deteriorate the crystallinity of the GaN surface, which results in that the proportion of the semiconductor metal in the semiconductor metal mixed layer is high and the thickness of the mixed layer increases. Furthermore, Patent Literature 2 discloses that the transparent conductive film is formed after the deterioration of the crystallinity of the GaN surface by the plasma particles and thus the semiconductor metal with the deteriorated crystal structure is further diffused within the transparent conductive film, which is considered to result in the generation of the aforementioned phenomenon. However, the paragraph 0058 of Patent Literature 2 discloses that there is no observed evidence of the deterioration of the crystallinity, and it has been known that the phenomenon regarding the diffusion is unclear.

As described above, the diffusion and the segregation of the material element that constitutes an epitaxial interface of the compound semiconductor are dependent on the type of the material element that constitutes an epitaxial interface, the growth conditions of the compound semiconductor, and the heat treatment method, etc, and the details thereof is unclear.

In addition, the Patent Literature 2 discloses that there exist the Ga-containing semiconductor metal element mixed layer (the translucent electrode layer side) and the In and Sn-containing translucent electrode metal mixed layer (the p-type semiconductor layer side), but there is no description regarding the diffusion state and the concentration distribution of the Sn dopant in the semiconductor metal element mixed layer (the translucent electrode layer side).

Meanwhile, when the ITO layer that functions as the p-type electrode is formed on the tope surface of the p-type semiconductor layer, Sn contained in ITO functions as the n-type dopant for the p-type semiconductor layer and generates the high contact resistance between the ITO and the p-type semiconductor layer. Accordingly, it becomes difficult to sufficiently reduce the contact resistance of the p-type electrode, which tends to be one of the barriers in the reduction of a driving voltage (Vf).

CITATION LIST

Patent Literature

[Patent Literature 1]
Japanese Unexamined Patent Application, First Publication No. 2007-73690
[Patent Literature 2]
Japanese Unexamined Patent Application, First Publication No. 2007-142028

SUMMARY OF INVENTION

Technical Problem

Under these circumstances, the present invention has been made, and an object thereof is to provide a semiconductor light-emitting device, which has a low driving voltage (Vf) and the low contact resistance between the p-type semiconductor layer and the translucent electrode layer, and a method for manufacturing the same.

Solution to Problem

In order to achieve the above object, the present invention employed the following constitutions.

[1] A semiconductor light-emitting device comprising:
a substrate;
a laminate semiconductor layer formed by sequentially laminating an n-type semiconductor layer, a light-emitting layer, and a p-type semiconductor layer on the substrate; and
a translucent electrode layer formed on a top surface of the p-type semiconductor layer, wherein
the translucent electrode layer contains Zn as a dopant element,
a content of the Zn within the translucent electrode layer decreases gradually toward the interface between the p-type semiconductor layer and the translucent electrode layer, and
in the translucent electrode layer is formed a diffusion region in which an element constituting the p-type semiconductor layer is diffused from the interface toward the inside of the translucent electrode layer.

[2] The semiconductor light-emitting device according to [1], wherein a concentration of an element constituting the p-type semiconductor layer is 2 atom % or higher at the position 5 nm apart from the interface in the diffusion region.

[3] The semiconductor light-emitting device according to [1] or [2], wherein the diffusion region has a thickness of 3 nm or more from the interface.

[4] The semiconductor light-emitting device according to any one of [1] to [3], wherein the diffusion region has a thickness of 5 nm or more from the interface.

[5] The semiconductor light-emitting device according to any one of [1] to [4], wherein a content of the dopant element within the diffusion region is lower than an average concentration of the dopant element in the overall translucent electrode layer.

[6] The semiconductor light-emitting device according to any one of [1] to [5], wherein the p-type semiconductor layer contains GaN.

[7] The semiconductor light-emitting device according to any one of [1] to [6], wherein the translucent electrode layer contains an oxide of at least one metal selected from the group consisting of In, Sn, Zn, Al, Ga, Ti, and Ce.

[8] The semiconductor light-emitting device according to [1], wherein the translucent electrode layer is formed of IZO.

[9] A method which manufactures the semiconductor light-emitting device according to any one of [1] to [8], comprising the steps of:
forming a laminate semiconductor layer by sequentially laminating an n-type semiconductor layer, a light-emitting layer, and a p-type semiconductor layer on the substrate; and
forming a translucent electrode layer containing Zn on a top surface of the p-type semiconductor layer, wherein
the step of forming the translucent electrode layer comprises a film formation step, in which a translucent electrode film is formed by a sputtering method, and a heat treatment step in which a heat treatment is performed at 300° C. to 800° C. after the film formation step.

[10] A method for manufacturing a semiconductor light-emitting device, which comprises the steps of:
forming a laminate semiconductor layer by sequentially laminating an n-type semiconductor layer, a light-emitting layer, and a p-type semiconductor layer on the substrate; and
forming a translucent electrode layer containing Zn on a top surface of the p-type semiconductor layer, wherein
the step of forming the translucent electrode layer comprises a film formation step, in which a translucent electrode film is formed by a sputtering method, and a heat treatment step in which a heat treatment is performed at 300° C. to 800° C. after the film formation step, and
the film formation step, in which the translucent electrode film is formed by the sputtering method, comprises a step in which the translucent electrode layer is formed by an RF sputtering and a DC sputtering and at least one of the RF sputtering and the DC sputtering comprises two targets.

[11] A method for manufacturing a semiconductor light-emitting device according to [10], which manufactures the semiconductor light-emitting device according to any one of [1] to [8].

[12] A lamp which is provided with the semiconductor light-emitting device according to any one of [1] to [8].

[13] An electronic device which is equipped with the lamp according to [12].

[14] A mechanical device which is equipped with the lamp according to [13].

Advantageous Effects of Invention

According to a semiconductor light-emitting device of the present invention, the translucent electrode layer contains Zn as a dopant element, the content of the Zn within the translucent electrode layer decreases gradually toward the interface between the p-type semiconductor layer and the translucent electrode layer, and in the translucent electrode layer is formed a diffusion region in which an element constituting the p-type semiconductor layer is diffused from the interface toward the inside of the translucent electrode layer. Therefore, the contact resistance of the translucent electrode layer formed on the top surface of the p-type semiconductor layer is sufficiently reduced, and consequently, it is possible to obtain the effect of reducing the driving voltage (Vf).

Moreover, according to a method for manufacturing a semiconductor light-emitting device of the present invention, it is possible to reduce the film formation time by using two targets in the sputtering method, which results in the improvement in the productivity. In particular, it is possible to manufacture the semiconductor light-emitting device having a low driving voltage (Vf) and the translucent electrode layer with the sufficiently low contact resistance of the interface.

DESCRIPTION OF EMBODIMENTS

Figure 1:
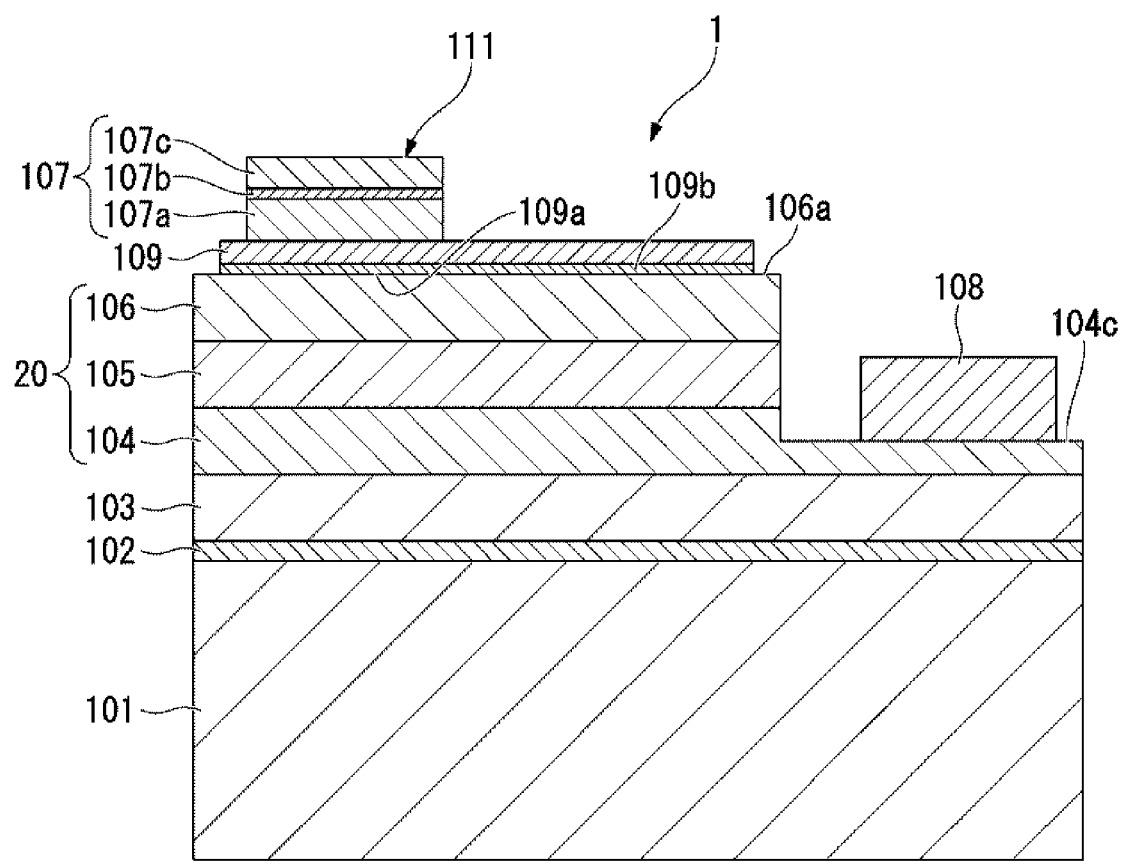
FIG. 1 is an example of a cross-sectional schematic diagram showing a semiconductor light-emitting device as the embodiment of the present invention.
Figure 2:
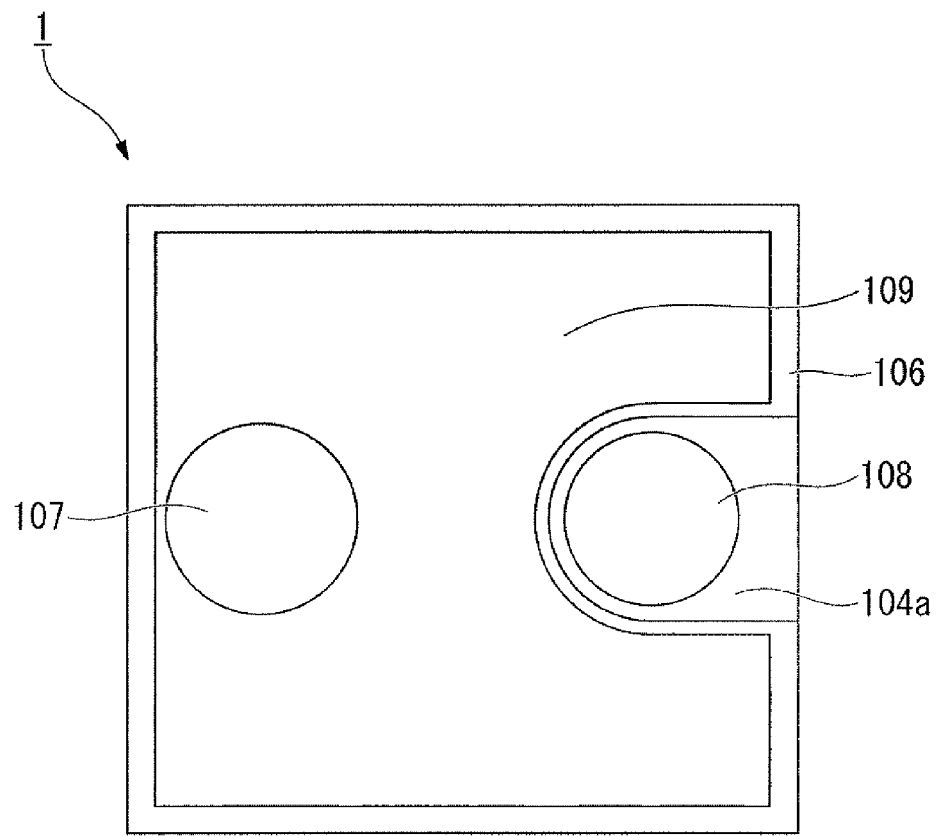
FIG. 2 is an example of a planar schematic diagram showing a semiconductor light-emitting device as the embodiment of the present invention.
Figure 3:
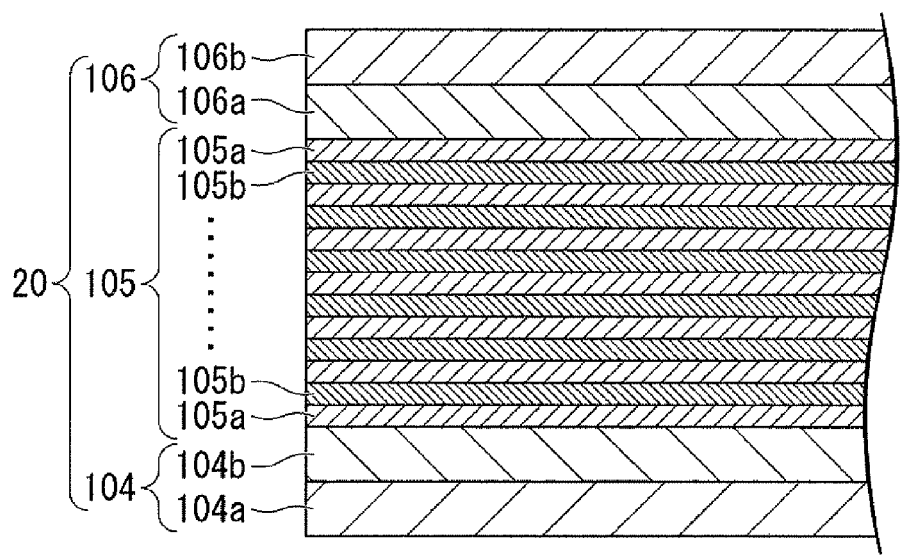
FIG. 3 is an example of a cross-sectional schematic diagram showing a laminate semiconductor layer that constitutes a semiconductor light-emitting device as the embodiment of the present invention.

A semiconductor light-emitting device and lamp provided with the semiconductor light-emitting device as the embodiments of the present invention will be described with reference to the accompanying drawings. The drawings used for reference in the following description are drawings for explaining a semiconductor light-emitting device and a lamp, and sizes, thickness and dimensions of the respective portions shown in the drawings are different from those of an actual semiconductor light-emitting device. FIG. 1 is an example of a cross-sectional schematic diagram of a semiconductor light-emitting device of the present embodiment, FIG. 2 is an example of a planar schematic diagram of a semiconductor light-emitting device, and FIG. 3 is an example of a cross-sectional schematic diagram of a laminate semiconductor layer that constitutes a semiconductor light-emitting device.
"Semiconductor Light-Emitting Device"

As shown in FIG. 1, a semiconductor light-emitting device 1 of the present embodiment is constituted by including a substrate 101, a laminate semiconductor layer 20 laminated on the substrate 101, a translucent electrode 109 laminated on the top surface of the laminate semiconductor layer 20, and a bonding pad electrode 107 laminated on the translucent electrode 109. The semiconductor light-emitting device 1 of the present embodiment is a face-up mounting type light-emitting device in which light from the light-emitting layer 105 of the laminate semiconductor layer 20 is taken out from the side where a bonding pad electrode 107 is formed.

As shown in FIG. 1, the laminate semiconductor layer 20 is constituted by laminating a plurality of semiconductor layers. More specifically, the laminate semiconductor layer 20 is constituted by laminating the n-type semiconductor layer 104, the light-emitting layer 105 and the p-type semiconductor layer 106 in this sequence from the substrate side. A portion of the p-type semiconductor layer 106 and that of the light-emitting layer 105 are removed by means such as etching, and a portion of an n-type semiconductor layer 104 is exposed from the removed portion. On an exposed surface 104c of this n-type semiconductor layer 104, an n-type electrode 108 is laminated.

On a top surface 106a of the p-type semiconductor layer 106, a translucent electrode layer 109 and a bonding pad electrode 107 are laminated. A p-type electrode 111 is constituted by these translucent electrode 109 and bonding pad electrode 107.

In the semiconductor light-emitting device 1 of the present embodiment, light is emitted from the light-emitting layer 105 by applying a current between the p-type electrode 111 and the n-type electrode 108.

The n-type semiconductor layer 104, the light-emitting layer 105 and the p-type semiconductor layer 106 are preferably made mainly of a compound semiconductor, more preferably made mainly of a Group III nitride semiconductor, and much more preferably made mainly of a gallium nitride-based semiconductor.

In the present embodiment, in the translucent electrode layer 109 laminated on the top surface 106a of the p-type semiconductor layer 106, there exists the "semiconductor metal element mixed layer" in which the metal element constituting the p-type semiconductor layer 106 is diffused from the interface 109a between the p-type semiconductor layer 106 and the translucent electrode layer 109 toward the inside of the translucent electrode layer 109. In other words, there exists (1) the p-type semiconductor layer/the interface/the semiconductor metal element mixed layer. In the present specification, the interface 109a may be defined as the position where 50 atom % of the concentration of Ga constituting the p-type semiconductor 106 is detected in the interfacial peripheral region of the p-type semiconductor layer/the interface/the semiconductor metal element mixed layer (the face at this position may be supposedly referred to as the interface 109a).

Moreover, in the present embodiment, in the p-type semiconductor layer 106, there exists the "translucent electrode metal mixed layer" in which the In and Zn elements constituting the translucent electrode layer 109 are diffused from the interface 109a between the p-type semiconductor layer 106 and the translucent electrode layer 109 toward the inside of the p-type semiconductor layer 106. In other words, there exists (2) the translucent electrode metal mixed layer/the interface/the translucent electrode layer.

In the present embodiment, there substantially exist the interfacial peripheral region represented by (3) the translucent electrode metal mixed layer (the p-type semiconductor layer side)/the interface/the semiconductor metal element mixed layer (the translucent electrode layer side) as the collective description of the interfacial peripheral region of (1) the p-type semiconductor layer/the interface/the semiconductor metal element mixed layer and the interfacial peripheral region of (2) the translucent electrode metal mixed layer/the interface/the translucent electrode layer.

In the present invention, the semiconductor metal element mixed layer (the translucent electrode layer side) is defined as the "diffusion region", and the characteristics of this diffusion region may be defined on the basis of the atom percentages (atom %) of Ga, In, and Zn which are obtained by the Secondary Ion Mass Spectrometry (SIMS) described below.

Figure 7:
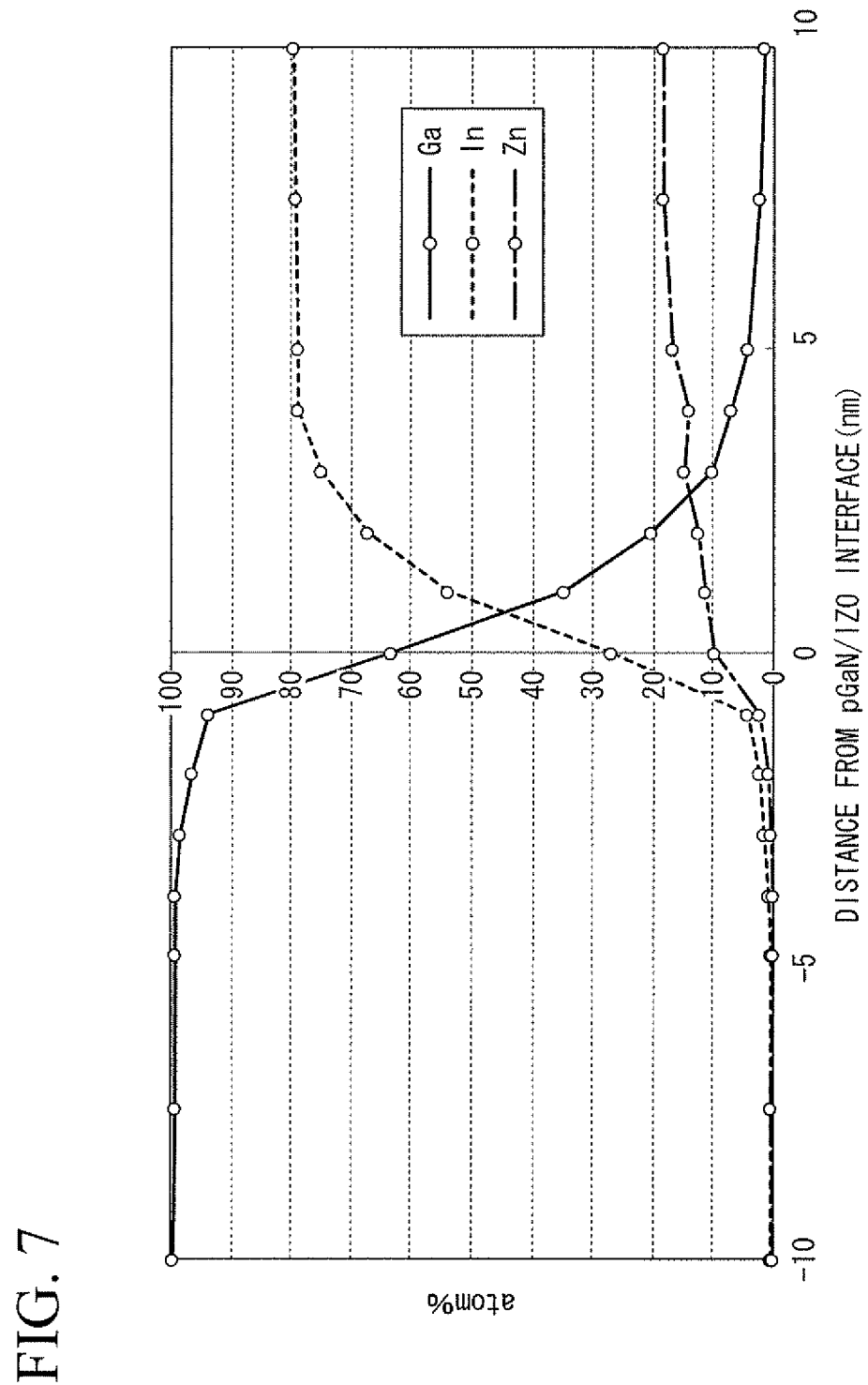
FIG. 7 is a graph showing the relationship between the concentrations (% by mass) of Ga, In, and Zn and the distance from the interface between the p-type semiconductor layer and the translucent electrode layer in the semiconductor light-emitting device of Examples.

It is particularly preferable that the diffusion region be defined on the basis of the depth range from the interface. For example, the diffusion region is preferably defined as the depth range in the atom percentage distribution curve of the each atom, in which the asymptotic regions more than 98% and less than 2% are removed, on the basis of the atom percentage distribution curves that represent the distance (nm) from the p-GaN/IZO interface as shown in FIG. 7.

In the present invention, the diffusion region preferably has a thickness of 2 nm or more from the interface 109a, more preferably 5 nm or more from the interface 109a, and much more preferably 10 nm or more from the interface 109a.

In the diffusion region, the concentration of the element constituting the p-type semiconductor layer 106 preferably decreases gradually apart from the interface 109a. For example, the concentration of the element constituting the p-type semiconductor layer 106 is preferably 20% or higher at the position 2 nm apart from the interface 109a, is preferably 10% or higher at the position 3 nm apart from the interface 109a, and is preferably 2% or higher at the position 10 nm apart from the interface 109a.

In the specific case where the p-type semiconductor layer 106 contains GaN, the Ga concentration of the diffusion region is preferably 20% or higher at the position 2 nm apart from the interface 109a, is preferably 10% or higher at the position 3 nm apart from the interface 109a, and is preferably 2% or higher at the position 10 nm apart from the interface 109a.

Moreover, the translucent electrode layer 109 contains the dopant element, and the content of the dopant element within the translucent electrode layer 109 decreases gradually toward the interface 109a between the p-type semiconductor layer 106 and the translucent electrode layer 109. In the case where the translucent electrode layer 109 is formed of IZO (indium zinc oxide ($In_2O_3$—ZnO)), the content of Zn that is the dopant element of IZO decreases gradually toward the interface 109a.

Accordingly, in the translucent electrode layer 109 of the present embodiment, there does not exist the region, where the content of the dopant element is higher than that in the periphery (the peak of the concentration), in the vicinity of the interface 109a between the p-type semiconductor layer 106 and the translucent electrode layer 109. When there exists the peak of the concentration of the dopant element within the translucent electrode layer 109 in the vicinity of the interface 109a between the p-type semiconductor layer 106 and the translucent electrode layer 109, the contact resistance of the translucent electrode layer 109 is not sufficiently reduced, and it is impossible to obtain the semiconductor light-emitting device 1 having a sufficiently low driving voltage (Vf).

In addition, in the present embodiment, the dopant element of the translucent electrode layer 109 is preferably diffused from the interface 109a between the p-type semiconductor layer 106 and the translucent electrode layer 109 toward the p-type semiconductor layer 106. Moreover, the concentration of the dopant element of the translucent electrode layer 109 diffused within the p-type semiconductor layer 106 is preferably lower than the lowest concentration of the dopant element in the translucent electrode layer 109.

Moreover, in the diffusion region constituting the p-type semiconductor layer 106, the content of the dopant element within the translucent electrode layer 109 is preferably lower than the average concentration of the dopant element in the overall translucent electrode layer 109. This kind of the translucent electrode layer 109 has a further low contact resistance.

The translucent electrode layer 109 to be laminated on the p-type semiconductor layer 106 preferably has small contact resistance with the p-type semiconductor layer 106. In order to extract light from the light-emitting layer 105 out of the side where the bonding pad electrode 107 is formed, the translucent electrode layer 109 is preferably excellent in light transmission properties. In order to uniformly diffuse a current over the entire surface of the p-type semiconductor layer 106, the translucent electrode layer 109 preferably has excellent conductivity.

As is apparent from the above description, the constituent material of the translucent electrode layer 109 preferably includes an oxide containing at least one kind selected from the group consisting of In, Sn, Zn, Al, Ga, Ti, and Ce. In particular, when the p-type semiconductor layer 106 contains GaN, it is preferable to use IZO (indium zinc oxide ($In_2O_3$—ZnO)), GZO (gallium zinc oxide (ZnO—$Ga_2O_3$)), IGO (indium gallium oxide), IGZO (InGaO3(ZnO)5), and AZO (aluminum-doped zinc oxide), etc as the constituent material of the translucent electrode layer 109 in order to prepare the translucent electrode layer 109 having a further low contact resistance.

Moreover, the translucent electrode layer 109 may also be formed so as to coat almost the entire surface of the top surface 106a of the p-type semiconductor layer 106, or may be formed into a lattice or tree shape by opening a gap.

Furthermore, the translucent electrode layer 109 may have a crystallized structure, and it is particularly preferable to use a translucent electrode (such as IZO) containing an $In_2O_3$ crystal having a hexagonal crystal structure or a bixbyite structure.

For example, when IZO containing an $In_2O_3$ crystal having a hexagonal crystal structure is used as the translucent electrode 109, an amorphous IZO film is formed, and thereafter, an amorphous state of the IZO film is converted through a heat treatment into a structure containing the crystal. Through the aforementioned process, it is possible to form the translucent electrode layer 109 having more excellent translucency than that of the electrode layer formed of the amorphous IZO film.

Moreover, when the IZO film is used as the translucent electrode layer 109, it is preferred to use a film with the composition that enables lowest resistivity. In order to obtain the IZO film having low resistivity, the ZnO concentration in IZO (the average concentration in the overall translucent electrode layer 109) is preferably within a range from 1 to 20% by mass, more preferably from 5 to 15% by mass, and particularly preferably 10% by mass.

The thickness of the IZO film is preferably within a range from 35 nm to 10,000 nm (10 μm) where low resistivity and high light transmittance can be obtained. In view of manufacturing costs, the thickness of the IZO film is preferably 1,000 nm (1 μm) or less.

Examples of the method of forming the translucent electrode layer 109, which is formed of IZO containing an $In_2O_3$ crystal having a hexagonal crystal structure, on the top surface 106a of the p-type semiconductor layer 106, include the method including the film formation step, in which the amorphous IZO film is formed at room temperature by a sputtering method, and a heat treatment step in which a heat treatment is performed at 300° C. to 800° C. after the film formation step to thereby crystallize the amorphous IZO film.

In the film formation method of the translucent electrode layer 109, a sputtering method is preferably used, but may not be used. Moreover, it is preferable to perform the heat treatment step in order to crystallize the amorphous IZO film and to improve the translucency of the translucent electrode layer 109 and the adhesion thereof with the p-type semiconductor layer 106.

The IZO film in the amorphous state can be formed, for example, into an IZO film containing an $In_2O_3$ crystal having a hexagonal crystal structure or an IZO film containing an $In_2O_3$ crystal having a bixbyite structure by performing a heat treatment at 300° C. to 800° C. In the case of crystallizing the IZO film in the amorphous state, when film formation conditions or heat treatment conditions for the IZO film vary, the crystal structure in the IZO film also varies.

When the temperature of the heat treatment to which the IZO film is subjected, is lower than 300° C., the IZO film may not be sufficiently crystallized and the obtained IZO film may not have sufficiently high light transmittance. In contrast, when the IZO film is subjected to the heat treatment at the temperature higher than 800° C., although the IZO film is crystallized, the obtained IZO film may not have sufficiently high light transmittance. When the heat treatment is performed at the temperature higher than 800° C., a semiconductor layer existing under the IZO film may deteriorate.

The heat treatment of the IZO film is preferably performed in an atmosphere that does not contain $O_2$, and examples of the atmosphere that does not contain $O_2$ include an inert gas atmosphere such as an $N_2$ atmosphere, and a mixed gas atmosphere of an inert gas such as $N_2$, and $H_2$. The atmosphere is preferably an $N_2$ atmosphere, or a mixed gas atmosphere of $N_2$ and $H_2$.

When the heat treatment of the IZO film is performed in the $N_2$ atmosphere, or the mixed gas atmosphere of $N_2$ and $H_2$, for example, it is possible to crystallize the IZO film to form a film containing an $In_2O_3$ crystal having a hexagonal crystal structure, and to effectively reduce the contact resistance of the IZO film.

It is preferred to perform patterning of the IZO film before performing a heat treatment step. Since the IZO film in the amorphous state becomes the crystallized IZO film by the heat treatment, it becomes difficult to perform etching when compared with the IZO film in the amorphous state. In contrast, the IZO film is in the amorphous state before the heat treatment, etching can be easily performed with good accuracy using a well-known etching liquid (for example, ITO-07N etching liquid, manufactured by KANTO CHEMICAL CO., INC.).

Etching of the IZO film in the amorphous state may also be performed using a dry etching device. In this case, $Cl_2$, $SiCl_4$, $BCl_3$ or the like can be used as an etching gas.

Next, it is preferred that the bonding pad electrode 107 reflects light from the light-emitting layer and is also excellent in tight adhesion with a bonding wire. As the bonding pad electrode 107, a conventionally known one can be used. Also, the bonding pad electrode 107 may have a laminate structure, and for example, preferably includes at least a metal reflective layer 107a formed of an alloy containing any one of Ag, Al, Ru, Rh, Pf, Os, Ir, and Pt group elements or any one of these metals, and a bonding layer 107c. More specifically, as shown in FIG. 1, the bonding pad electrode 107 is preferably a laminate in which the metal reflective layer 107a, the barrier layer 107b and the bonding layer 107c are sequentially laminated from the translucent electrode 109 side. The bonding pad electrode 107 may have a single-layered structure made only of the metal reflective layer 107a, or may have a two-layered structure of the metal reflective layer 107a and the bonding layer 107c.

Moreover, in order to improve the tight adhesion between the translucent electrode layer 109 and the metal reflective layer 107a, it is possible to use the junction layer formed of at least one element selected from the group consisting of Al, Ti, V, Cr, Mn, Co, Zn, Ge, Zr, Nb, Mo, Ru, Hf, Ta, W, Re, Rh, Ir, and Ni. Among these, the junction layer, which is formed of at least one element selected from the group consisting of Cr, Ti, W, Mo, Zr, Hf, Co, Rh, Ir, and Ni, is preferred.

The metal reflective layer 107a shown in FIG. 1 is preferably made of metal having a high reflectance, and more preferably made of platinum group metals such as Ru, Rh, Pd, Os, Ir and Pt, Al, Ag, and an alloy containing at least one kind of these metals.

When the metal reflective layer 107a is formed of metal having a high reflectance, the thickness is preferably from 20 to 3,000 nm. When the metal reflective layer 107a is too thin, a sufficient reflection effect cannot be obtained. In contrast, the metal reflective layer is too thick, a merit is not particularly obtained and only an increase in the time of the step and the wastage of material arise.

The barrier layer 107b to be formed on the reflective layer of the bonding pad electrode 107 has a role to increase the strength of the entire bonding pad electrode 107 and a role of a diffusion prevention barrier of an element. Ti, Cr, or Al is desirably as the material. Among these, Ti is desirable in view of the strength of the material, but it is not necessary to use the barrier layer according to the element composition of the boding pad electrode 107.

The thickness of the barrier layer 107b is desirably from 20 to 3,000 nm. When the barrier layer 107b is too thin, a sufficient effect of increasing the strength is not obtained. In contrast, even when the layer is too thick, there arises no merit, particularly, and only an increase in costs arises.

The bonding layer 107c that would be the top layer (opposite the reflective layer) of the bonding pad electrode 107 is desirably made of the material having satisfactory tight adhesion with a bonding ball. Gold is often used as the material of the bonding ball, and Au and Al are known as metals having satisfactory tight adhesion with the gold ball. Among these metals, gold is particularly desirably. The thickness of this top layer is desirably from 50 to 2000 nm, and more desirably from 100 to 1,500 nm. When the top layer is too thin, tight adhesion with the bonding ball becomes worse. In contrast, even when the top layer is too thick, there arises no merit, particularly, and only an increase in costs arises.

The light directed towards the bonding pad electrode 107 is reflected on the metal reflective layer 107a as the bottom surface (surface of the translucent electrode side) of the bonding pad electrode 107, and a portion of the light is scattered and travels in a transverse direction or a diagonal direction, while a portion of the light travels directly under the bonding pad electrode 107. The light scattered and traveled in the transverse direction or the diagonal direction is extracted out from a side face of a semiconductor light-emitting device 1. In contrast, the light traveled in the direction directly under the bonding pad electrode 107 is further scattered and reflected on the surface under the semiconductor light-emitting device 1 and then extracted outside through the side face or the translucent electrode 109 (portion on which a bonding pad electrode does not exist).

A substrate and a laminate semiconductor layer 20, that constitute a semiconductor light-emitting device 1 of the present embodiment, will be described below.

(Substrate)

A substrate 101 of the semiconductor light-emitting device of the present embodiment is not particularly limited as long as it is a substrate in which a Group III nitride semiconductor crystal is epitaxially grown on the surface, and various substrates can be selected and used. It is possible to use substrates made of sapphire, SiC, silicon, zinc oxide, magnesium oxide, manganese oxide, zirconium oxide, iron manganese zinc oxide, magnesium aluminum oxide, zirconium boride, gallium oxide, indium oxide, lithium gallium oxide, lithium aluminum oxide, neodymium gallium oxide, lantern strontium aluminum tantalum oxide, strontium titanium oxide, titanium oxide, hafnium, tungsten and molybdenum.

Among the above substrates, a sapphire substrate having a c-plane as a principal plane is preferably used. When the sapphire substrate is used, an intermediate layer 102 (buffer layer) may be formed on the c-plane of sapphire.

(Laminate Semiconductor Layer)

The laminate semiconductor layer is made of a Group III nitride semiconductor, and includes each of an n-type semiconductor layer 104, a light-emitting layer 105 and a p-type semiconductor layer 106 laminated in this sequence on a substrate as shown in FIG. 1 and FIG. 3. The laminate semiconductor layer 20 may also be called even when it further includes a ground layer 103 and an intermediate layer 102. When the laminate semiconductor layer 20 is formed by a MOCVD method, those having satisfactory crystallinity can be obtained, and a semiconductor layer having more excellent crystallinity than that obtained in the case of using a MOCVD method can be formed by optimizing the conditions, using a sputtering method. A description will be sequentially made below.

(Buffer Layer)

A buffer layer 102 is preferably made of polycrystalline $Al_xGa_{1-x}N$ ($0 \leqq x \leqq 1$), and more preferably monocrystalline $Al_xGa_{1-x}N$ ($0 \leqq x \leqq 1$).

As described above, the buffer layer 102 can be made, for example, of polycrystalline $Al_xGa_{1-x}N$ ($0 \leqq x \leqq 1$), the thickness being from 0.01 to 0.5 µm. When the thickness of the buffer layer 102 is less than 0.01 µm, a sufficient effect of relaxing a difference in a lattice constant between the substrate 101 and the ground layer 103 may not be obtained by the buffer layer 102. In contrast, when the thickness of the buffer layer 102 is more than 0.5 µm, regardless of no change in function of the buffer layer 102, the time of the film formation treatment of the buffer layer 102 may be prolonged, resulting in decrease in productivity.

The buffer layer 102 has a function of relaxing a lattice constant between the substrate 101 and the ground layer 103, and facilitating formation of a c-axis oriented single crystal layer on a (0001) c-plane of the substrate 101. Therefore, the ground layer 103 having more satisfactory crystallinity can be laminated by forming the buffer layer 102.

The buffer layer 102 may have a hexagonal crystal structure made of a Group III nitride semiconductor. A crystal of a Group III nitride semiconductor, that constitutes the buffer layer 102, may have a single crystal structure and those having a single crystal structure are preferably used. The crystal of the Group III nitride semiconductor grows not only in an upward direction, but also in an in-plane direction to form a single crystal structure by controlling the growth conditions. Therefore, a buffer layer 102 made of a crystal having a single crystal structure of a Group III nitride semiconductor can be formed by controlling the film formation conditions of the buffer layer 102. When the buffer layer 102 having a single crystal structure is formed on the substrate 101, since a buffer function of the suffer layer 102 is effectively exerted, a crystal film having satisfactory orientation and crystallinity is obtained from the Group III nitride semiconductor formed thereon.

By controlling the film formation conditions, the Group III nitride compound crystals that constitute a buffer layer 102 can be formed as columnar crystals made of a texture based on hexagonal columns (polycrystals). Herein, columnar crystals made of a texture refer to crystals in which a crystal grain boundary is formed between adjacent crystal grains, and the crystals themselves adopt a columnar shape in a longitudinal cross-section.

(Ground Layer)

Although the ground layer 103 includes $Al_xGa_yIn_zN$ ($0 \leqq x \leqq 1$, $0 \leqq y \leqq 1$, $0 \leqq z \leqq 1$, $x+y+z=1$), use of $Al_xGa_{1-x}N$ ($0 \leqq x \leqq 1$) is preferred since the ground layer 103 having satisfactory crystallinity can be formed.

The thickness of the ground layer 103 is preferably 0.1 µm or more, more preferably from 0.5 µm or more, and most preferably 1 µm or more. When the thickness is controlled to this thickness or more, it is easy to obtain $AlxGa_{1-x}N$ layer having satisfactory crystallinity.

In order to improve crystallinity of the ground layer 103, it is preferred that the ground layer 103 is not doped with impurities. However, when p-type or n-type conductivity is required, acceptor impurities or donor impurities can be added.

(n-Type Semiconductor Layer)

Usually, the n-type semiconductor layer 104 is preferably made of an n-type contact layer 104a and an n-type clad layer 104b. The n-type contact layer 104a can also function as the n-type clad layer 104b. The above ground layer may be included in the n-type semiconductor layer 104.

The n-type contact layer 104a is a layer for providing an n-type electrode. The n-type contact layer 104a is preferably made of $Al_xGa_{1-x}N$ layer ($0 \leqq x \leqq 1$, preferably $0 \leqq x \leqq 0.5$, and more preferably $0 \leqq x \leqq 0.1$). The n-type contact layer 104a is preferably doped with n-type impurities. It is preferred that the n-type contact layer preferably contains n-type impurities in the concentration within a range from $1 \times 10^{17}$ to $1 \times 10^{20}/cm^3$, and preferably from $1 \times 10^{18}$ to $1 \times 10^{19}/cm^3$, in view of maintaining of satisfactory ohmic contact with the n-type electrode. Examples of n-type impurities include, but are not limited to, Si, Ge and Sn. Among these impurities, Si and Ge are preferable.

The thickness of the n-type contact layer 104a is preferably controlled within a range from 0.5 to 5 µm, and more preferably from 1 to 3 µm. When the thickness of the n-type contact layer 104a is within the above range, crystallinity of the semiconductor can be satisfactory maintained.

Between the n-type contact layer 104a and the light-emitting layer 105, an n-type clad layer 104b is preferably provided. The n-type clad layer 104b is a layer of performing injection of carriers and confinement of carriers to the light-emitting layer 105. The n-type clad layer 104b can be formed of AlGaN, GaN, GaInN or the like. Moreover, the n-type clad layer may also take a superlattice structure having a heterojunction, or multiple laminations of these structures. When the n-type clad layer 104b is formed of GaInN, it is needless to say that the band gap is desirably more than that of GaInN of the light-emitting layer 105.

The thickness of the n-type clad layer 104b is not particularly limited and is preferably from 0.005 to 0.5 µm, and more preferably from 0.005 to 0.1 µm. The n-type dopant concentration of the n-type clad layer 104b is preferably from $1 \times 10^{17}$ to $1 \times 10^{20}/cm^3$, and more preferably from $1 \times 10^{18}$ to $1 \times 10^{19}/cm^3$. When the dopant concentration is within the above range, it is preferred in view of maintaining of satisfactory crystallinity and decreasing an operating voltage of the device.

When the n-type clad layer 104b is a layer having a superlattice structure, although diagrammatic representation is omitted, the n-type clad layer may have a structure in which an n-side first layer made of a Group III nitride semiconductor having a thickness of 100 angstroms or less, and an n-side second layer that has the composition different from that of the n-side first layer and is made of a Group III nitride semiconductor having a thickness of 100 angstroms or less are laminated. Alternatively, the n-type clad layer 104b may be a structure in which n-side first layers and n-side second layers are laminated alternately and repeatedly. Preferably, it may have a structure in which either the n-side first layer or the n-side second layer may be contacted with an active layer (light-emitting layer 105).

The n-side first layer and n-side second layer described above can have, for example, an AlGaN-based (sometimes simply referred to as AlGaN) composition containing Al, a GaInN-based (sometimes simply referred to as GaInN) composition containing In, or a GaN composition. The n-side first layer and n-side second layer may have a GaInN/GaN alternative structure, an AlGaN/GaN alternative structure, a GaInN/AlGaN alternative structure, a GaInN/GaInN alternative structure having a different composition (the description "different composition" in the present invention means that each element composition ratio is different, and the same shall apply hereinafter), or an AlGaN/AlGaN alternative structure having a different composition. In the present invention, the n-side first layer and the n-side second layer may have a GaInN/GaN alternative structure or a GaInN/GaInN having a different composition.

Each thickness of the superlattice layer of the n-side first layer and the n-side second layer is preferably 60 angstroms or less, more preferably 40 angstroms or less, and most preferably within a range from 10 angstroms to 40 angstroms. When the thickness of the n-side first layer and the n-side second layer, that form the superlattice layer, is more than 100 angstroms, crystal defects are likely to occur, and therefore it is not preferred.

Each of the n-side first layer and the n-side second layer may have a doped structure, or a combination of doped structure/undoped structures. It is possible to apply, as impurities to be doped, conventionally known impurities to the above material composition without any limitation. For example, when those having a GaInN/GaN alternative structure or a GaInN/GaInN alternative structure having a different composition are used as the n-type clad layer, Si is suitable as impurities. The above n-side superlattice multi-layered film may be formed while appropriately doping on or doping off even when the composition such as GaInN, AlGaN or GaN is the same.

(Light-Emitting Layer)

The light-emitting layer 105 to be laminated on the n-type semiconductor layer 104 includes a light-emitting layer 105 having a single quantum well structure or a multiple quantum well structure. It is possible to use, as a well layer 105b shown having a quantum well structure as shown in FIG. 3, for example, a Group III nitride semiconductor layer made of $Ga_{1-y}In_yN$ ($0 \leq y \leq 0.4$) is usually used. The thickness of the well layer 105b can be controlled to the thickness enough to obtain the quantum effect, for example, 1 to 10 nm. The thickness is preferably controlled within a range from 2 to 6 nm in view of a light emission output.

In addition, the Group III nitride semiconductor layer made of $Al_zGa_{1-z}N$ ($0 \leq z < 0.3$), which has a larger bandgap energy than that of the well layer 105b, is used as the barrier layer 105a. It is possible to dope or undope the well layer 105b and the barrier layer 105a with impurities by design.

(p-Type Semiconductor Layer)

The p-type semiconductor layer 106 is usually made of a p-type clad layer 106a and a p-type contact layer 106b. The p-type contact layer 106b can also functions as p-type clad layer 106a.

The p-type clad layer 106a is a layer which performs confinement of carriers and injection of carriers to a light-emitting layer 105. The p-type clad layer 106a has the composition having larger band gap energy than that of the light-emitting layer 105 and is not particularly limited as long as it can perform confinement of carriers to the light-emitting layer 105, an is preferably $Al_xGa_{1-x}N$ ($0 < x \leq 0.4$). The p-type clad layer 106a is preferably made of AlGaN in view of confinement of carriers to the light-emitting layer. The thickness of the p-type clad layer 106a is not particularly limited, and is preferably from 1 to 400 nm, and more preferably from 5 to 100 nm. The p-type dopant concentration of the p-type clad layer 106a is preferably from $1 \times 10^{18}$ to $1 \times 10^{21}$/cm$^3$, and more preferably from $1 \times 10^{19}$ to $1 \times 10^{20}$/cm$^3$. When the p-type dopant concentration is within the above range, a satisfactory p-type crystal is obtained without causing deterioration of crystallinity.

The p-type clad layer 106a may have a superlattice structure having multiple laminations of these structures.

When the p-type clad layer 106a is a layer having a superlattice structure, although diagrammatic representation is omitted, the p-type clad layer may have a structure in which a p-side first layer made of a Group III nitride semiconductor having a thickness of 100 angstroms or less, and a p-side second layer that has the composition different from that of the p-side first layer and is made of a Group III nitride semiconductor having a thickness of 100 angstroms or less are laminated. Alternatively, the p-type clad layer may be a structure in which p-side first layers and p-side second layers are laminated alternately and repeatedly.

Each of the above p-side first layer and p-side second layer may have a different composition, or may have any one of the compositions of AlGaN, GaInN and GaN, or may have a GaInN/GaN alternative structure, an AlGaN/GaN alternative structure, or a GaInN/AlGaN alternative structure. In the present invention, the p-side first layer and the p-side second layer preferably have an AlGaN/AlGaN or AlGaN/GaN alternative structure.

Each thickness of the superlattice layer of the p-side first layer and the p-side second layer is preferably 60 angstroms or less, more preferably 40 angstroms or less, and most preferably within a range from 10 angstroms to 40 angstroms. When the thickness of the p-side first layer and the p-side second layer, that form the superlattice layer, is more than 100 angstroms, crystal defects are likely to occur, and therefore it is not preferred.

Each of the p-side first layer and the p-side second layer may have a doped structure, or a combination of doped structure/undoped structures. It is possible to apply, as impurities to be doped, conventionally known impurities to the above material composition without any limitation. For example, when those having a GaInN/GaN alternative structure or a GaInN/GaInN alternative structure having a different composition are used as the p-type clad layer, Si is suitable as impurities. The above p-side superlattice multi-layered film may be formed while appropriately doping on or doping off even when the composition such as GaInN, AlGaN or GaN is the same.

The p-type contact layer 106b is a layer for providing a positive electrode. The p-type contact layer 106b is preferably $Al_xGa_{1-x}N$ ($0 \leq x \leq 0.4$). When the Al composition is within the above range, it is preferred in view of maintaining of satisfactory crystallinity and satisfactory ohmic contact with a p-type ohmic electrode. When p-type impurities (dopant) are contained in the concentration within a range from $1 \times 10^{18}$ to $1 \times 10^{21}$/cm$^3$, and preferably from $5 \times 10^{19}$ to $5 \times 10^{20}$/cm$^3$, it is preferred in view of maintaining of satisfactory ohmic contact, prevention of the occurrence of cracks, and maintaining of satisfactory crystallinity. There is not particular limitation on p-type impurities and, for example, Mg is preferably exemplified. The thickness of the p-type contact layer 106b is not particularly limited, and is preferably within a range from 0.01 to 0.5 μm, and more preferably from 0.05 to 0.2 μm. When the thickness of the p-type contact layer 106b is within the above range, it is preferred in view of light emission output.

(n-Type Electrode)

The n-type electrode 108 also functions as a bonding pad and is formed so as to be adjacent to an n-type semiconductor layer 104 of a laminate semiconductor layer 20. Therefore, when the n-type electrode 108 is formed, a portion of a light-emitting layer 105 and that of a p-type semiconductor layer 106 are removed to expose an n-type contact layer of the n-type semiconductor layer 104 to form the n-type electrode 108 that also functions as a bonding pad on an exposed surface 104c.

As the n-type electrode 108, various compositions and structures are well known, and these well-known compositions and structures can be used without any limitation and can be provided by commonly used means that is well known in the relevant technical field. Particularly, the n-type electrode 108 may have the electrode structure selected arbitrarily from the structure variations which are the same as those of the aforementioned boding pad electrode 107, and may have the same electrode structure as the boding pad electrode 107.
(Method for Manufacturing Semiconductor Light-Emitting Device)

In order to manufacture a semiconductor light-emitting device 1 of the present embodiment, first, a substrate 101 such as a sapphire substrate is prepared.

Next, a buffer layer 102 is laminated on the top surface of a substrate 101.

When the buffer layer 102 is formed on the substrate 101, it is desired that the buffer layer 102 is formed after subjecting the substrate 101 to a pretreatment.

The pretreatment includes, for example, a method in which a substrate 101 is disposed in a chamber of a sputtering apparatus and sputtering is performed before forming a buffer layer 102. Specifically, a pretreatment of cleaning the top surface may be performed by exposing the substrate 101 in a plasma of Ar or $N_2$ in a chamber. It is possible to remove an organic substance or an oxide adhered onto the top surface of the substrate 101 by reacting a plasma of an Ar gas or a $N_2$ gas with the substrate 101.

On the substrate 101, a buffer layer 102 is formed by a sputtering method. When a buffer layer 102 having a single crystal structure is formed by a sputtering method, it is desired to control a ratio of a nitrogen flow rate to a flow rate of a nitrogen material and an inert gas in a chamber so that the content of the nitrogen material becomes 50% to 100%, and preferably 75%.

When a buffer layer 102 including a columnar crystal (polycrystal) is formed by a sputtering method, it is desired to control a ratio of a nitrogen flow rate to a flow rate of a nitrogen material and an inert gas in a chamber so that the content of the nitrogen material becomes 1% to 50%, and preferably 25%. The buffer layer 102 can be formed not only by the above sputtering method, but also by a MOCVD method.

After forming the buffer layer, a monocrystalline ground layer 103 is formed on the top surface of substrate 101 on which the buffer layer 102 was formed. It is desired that the ground layer 103 is formed using a sputtering method. When the sputtering method is used, it becomes possible to make the constitution of an apparatus simple when compared with a MOCVD method or a MBE method. In the case of forming the ground layer 103 using a sputtering method, it is preferred to use a film formation method using a reactive sputtering method of allowing Group V materials such as nitrogen to flow through a reactor.

Commonly, in the sputtering method, the more purity of a target material is higher, film quality such as crystallinity of a thin film after formation becomes better. When the ground layer 103 is formed by the sputtering method, it is also possible to perform sputtering by a plasma of an inert gas such as an Ar gas using a Group III nitride semiconductor as a target material which is a raw material. However, in a reactive sputtering method, it is possible to increase purity of a Group III material alone of a mixture thereof to be used as the target material compared with the Group III nitride semiconductor. Therefore, according to the reactive sputtering method, it becomes possible to further improve crystallinity of the ground layer 103 to be formed.

The temperature of substrate 101 in the case of forming the ground layer 103, namely, the growing temperature of the ground layer 103 is preferably controlled to 800° C. or higher, more preferably 900° C. or higher, and most preferably 1,000° C. or higher. The reason is as follows. That is, when the temperature of the substrate 101 is increased in the case of forming the ground layer 103, migration of atoms is likely to occur, and thus dislocation loop easily proceeds. It is necessary that the temperature of substrate 101 in the case of forming the ground layer 103 is lower than the temperature at which a crystal is decomposed, and therefore the temperature is preferably controlled to lower than 1,200° C. When the temperature of substrate 101 in the case of forming the ground layer 103 is within the above temperature range, a ground layer 103 having satisfactory crystalline is obtained.

After formation of the ground layer 103, an n-type contact layer 104a and an n-type clad layer 104b are laminated to form an n-type semiconductor layer 104. The n-type contact layer 104a and the n-type clad layer 104b may be formed by either a sputtering method or a MOCVD method.

A light-emitting layer 105 may be formed by either a sputtering method or a MOCVD method, and preferably a MOCVD method. Specifically, barrier layers 105a and well layers 105b may be laminated alternately and repeatedly, and also laminated in the sequence where the barrier layer 105a is disposed at the n-type semiconductor layer 104 side and the p-type semiconductor layer 106 side.

A p-type semiconductor layer 106 may be formed by either a sputtering method or a MOCVD. Specifically, p-type clad layers 106a and p-type contact layers 106b may be sequentially laminated.

Thereafter, a translucent electrode film that becomes the translucent electrode layer 109 is formed on the p-type semiconductor layer 106 at room temperature, for example, by a sputtering method. After taken out from the sputtering apparatus, the translucent electrode layer is subjected to the heat treatment at 300° C. to 800° C., so as to form the translucent electrode layer 109 (heat treatment step).

Subsequently, patterning is performed, for example, by photolithography, followed by etching a portion of laminate semiconductor layer in a predetermined range, thereby exposing a portion of an n-type contact layer 104a to form an n-type electrode 108 on an exposed area 104c of the n-type contact layer 104a.

On the translucent electrode 109, then a metal reflective layer 107a, a barrier layer 107b and a bonding layer 107c are sequentially laminated to form a bonding pad electrode 107.

In this manner, a semiconductor light-emitting device 1 shown in FIG. 1 to FIG. 3 is manufactured.

According to a semiconductor light-emitting device 1 of the present embodiment, the translucent electrode layer 109 contains the dopant element, the content of the dopant element within the translucent electrode layer 109 decreases gradually toward the interface 109a between the p-type semiconductor layer 106 and the translucent electrode layer 109, and in the translucent electrode layer 109 is formed a diffusion region in which the element constituting the p-type semiconductor layer 106 is diffused from the interface 109a toward the inside of the translucent electrode layer 109. Therefore, the contact resistance of the translucent electrode layer 109 formed on the top surface 106a of the p-type semiconductor layer 106 is sufficiently reduced, and the driving voltage (Vf) is reduced.

Moreover, the diffusion region, which is formed from the interface 109a between the p-type semiconductor layer 106 and the translucent electrode layer 109 toward the inside of the translucent electrode layer 109, has a thickness of 3 nm or more from the interface, preferably 5 nm or more, and more preferably 10 nm. Within the above range, it is possible to further efficiently obtain the effect in which the contact resistance is reduced by forming the diffusion region in the translucent electrode layer 109, and the driving voltage (Vf) can be further reduced.

Furthermore, in the case where the concentration of the element (Ga) constituting the p-type semiconductor layer 106 is 2 atom % or higher at the position about 5 nm apart from the interface 109a in the diffusion region, it is possible to further efficiently obtain the effect in which the contact resistance is reduced by forming the diffusion region in the translucent electrode layer 109, and the driving voltage (VI) can be further reduced.

Furthermore, in the case where the content of Zn, which is the dopant element within the diffusion region, is lower than the average concentration in the overall translucent electrode layer 109, it is possible to obtain the significant effect of reducing the contact resistance.

Moreover, in the case where the p-type semiconductor layer 106 contains GaN and the translucent electrode layer 109 is formed of IZO, Zn (dopant element) contained in IZO can function as the p-type dopant for the p-type semiconductor layer 106, and it is possible to efficiently reduce the contact resistance between the translucent electrode layer 109 and the p-type semiconductor layer 106. Therefore, the contact resistance of the translucent electrode layer 109 can be sufficiently reduced, and the driving voltage (Vf) can be reduced.

Moreover, when, in the present invention, the step, in which the translucent electrode layer 109 on the p-type semiconductor layer is formed by simultaneously discharging the two target 2 in the chamber (unillustrated), preferably includes the film formation step, in which the translucent electrode film is formed at room temperature, and a heat treatment step in which the heat treatment is performed at 300° C. to 800° C. after the film formation step. In this case, it is possible to improve the translucency of the translucent electrode layer 109 and the adhesion thereof with the p-type semiconductor layer 106. The temperature of the heat treatment is preferably within a range from 500° C. to 800° C., and more preferably from 600° C. to 800° C.

(Lamp)

The lamp of the present embodiment is formed with use of the light-emitting device 1 of the present embodiment.

The lamp of the present embodiment includes, for example, a lamp in which the above light-emitting device 1 and a phosphor are combined. By combining the light-emitting device 1 and the phosphor, it is possible to configure a lamp using techniques known to those skilled in the art. Techniques for changing the light emission color by combining the light-emitting device 1 and the phosphor are conventionally well known, and these types of techniques can also be adopted without any particular limitation in the lamp of the present embodiment.

Figure 4:
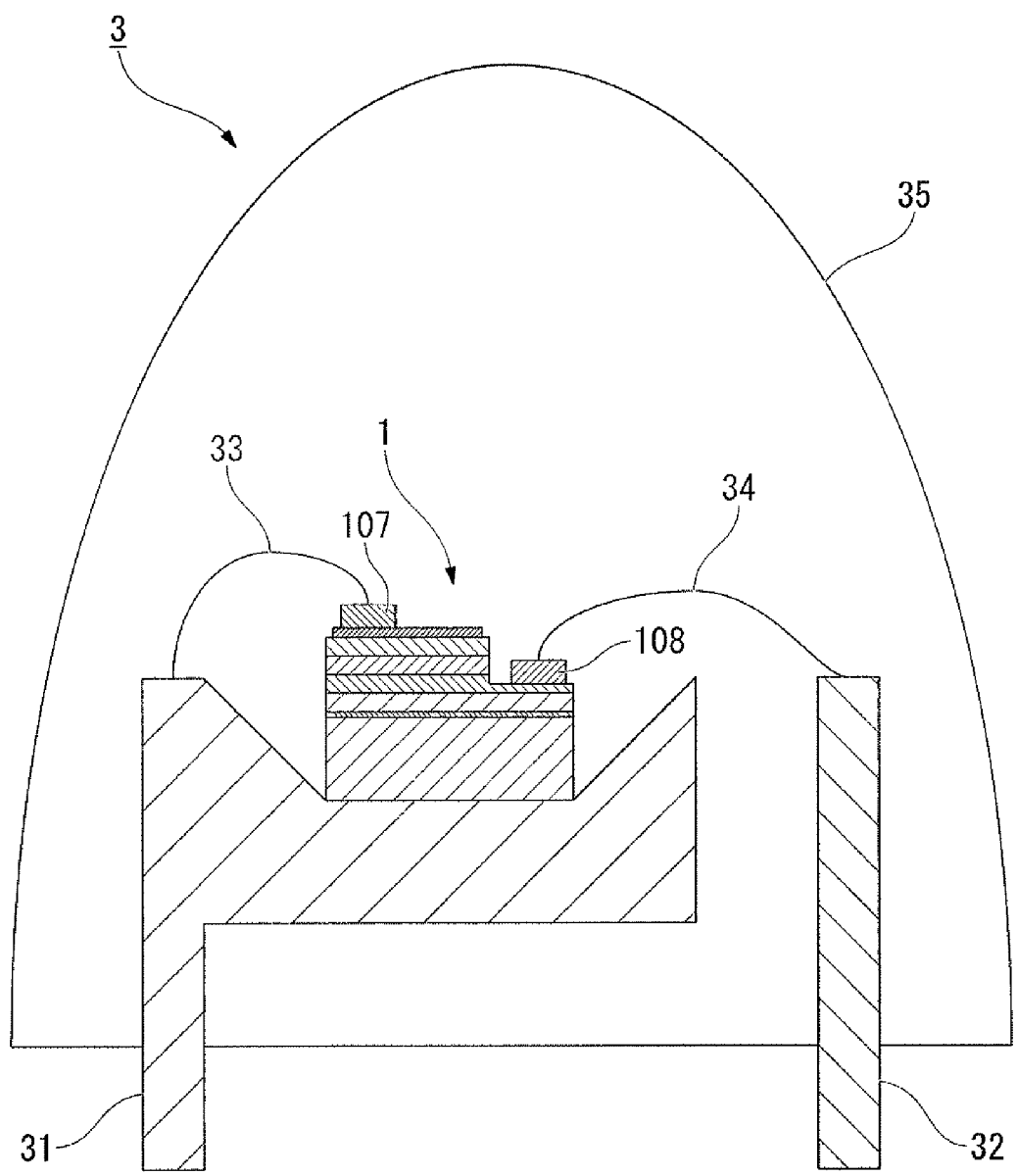
FIG. 4 is an example of a cross-sectional schematic diagram showing a lamp provided with a semiconductor light-emitting device as the embodiment of the present invention.

FIG. 4 is a cross-sectional schematic diagram showing one example of a lamp of the present invention and a diagram schematically showing a lamp formed by using the above semiconductor light-emitting device 1. A lamp 3 shown in FIG. 4 is a bullet-shaped lamp and the light-emitting device 1 shown in FIG. 1 is used. As shown in FIG. 4, a bonding pad electrode 107 of the semiconductor light-emitting device 1 is bonded to one (refer to reference symbol 31 shown in FIG. 4) of two frames 31, 32 using a wire 33, and n-type electrode 108 (bonding pad) of the light-emitting device 1 is bonded to the other frame 32 using a wire 34, thereby mounting the light-emitting device 1. The periphery of the light-emitting device 1 is sealed with a mold 35 made of a transparent resin.

The lamp of the present embodiment is formed with use of the above light-emitting device 1 and therefore has a low driving voltage (Vf) and excellent light emission properties.

Furthermore, the lamp of the present embodiment can be used within all manner of applications, including bullet-shaped lamps for general applications, side view lamps for portable backlight applications, and top view lamps used in display equipment.

Moreover, in the lamp manufactured using the semiconductor light-emitting device of the present invention, the driving voltage (VI) can be reduced as described above. Therefore, it is possible to realize low-power-consumption driving in electronic devices equipped with the aforementioned lamp such as a backlight, a cell phone, a display, various panels, a computer, a game machine, and an illumination lamp, and mechanical deices such as an automobile equipped with the electronic device, and the improved properties can be realized. In particular, low-power-consumption is preferably realized in the battery-powered devices such as a backlight, a cell phone, a display, a game machine, and an illumination lamp.

EXAMPLES

The present invention will be described in more detail by way of Examples, but the present invention is not limited only to these Examples.

Example 1

Semiconductor light-emitting devices comprised of nitride gallium-based compound semiconductors shown in FIG. 1 to FIG. 3 were manufactured. In the semiconductor light-emitting device of Example 1, on a substrate 101 made of sapphire, a 8 μm thick ground layer 103 made of undoped GaN, a 2 μm thick Si-doped n-type GaN contact layer 104a, a 250 nm thick n-type $In_{0.1}Ga_{0.9}N$ clad layer 104b, a 16 nm thick Si-doped GaN barrier layer and a 2.5 nm thick $In_{0.2}Ga_{0.8}N$ well layer were laminated five times through a buffer layer 102 made of AlN. Finally, a light-emitting layer 105 having a multiple quantum well structure provided with a barrier layer, a 10 nm thick Mg-doped p-type $Al_{0.07}Ga_{0.93}N$ clad layer 106a and a 150 nm thick Mg-doped p-type GaN contact layer 106b were sequentially laminated.

The buffer layer was formed by the sputtering method, and the lamination of the other nitride gallium-based compound semiconductor layers was performed by a MOCVD method under conventional conditions that are well known in the relevant technical field.

Figure 5A:
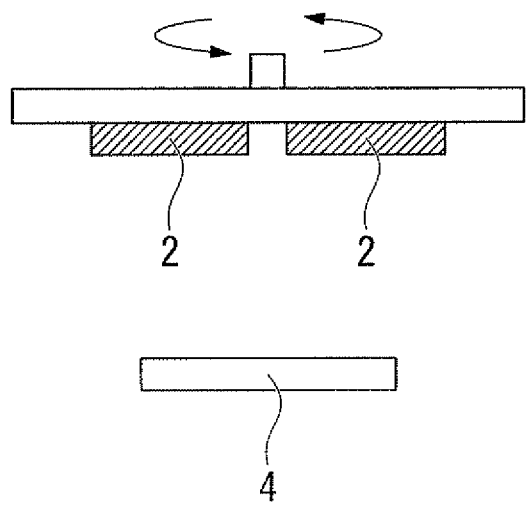
FIG. 5A is a cross-sectional schematic diagram showing the sputtering apparatus used in Example.
Figure 5B:
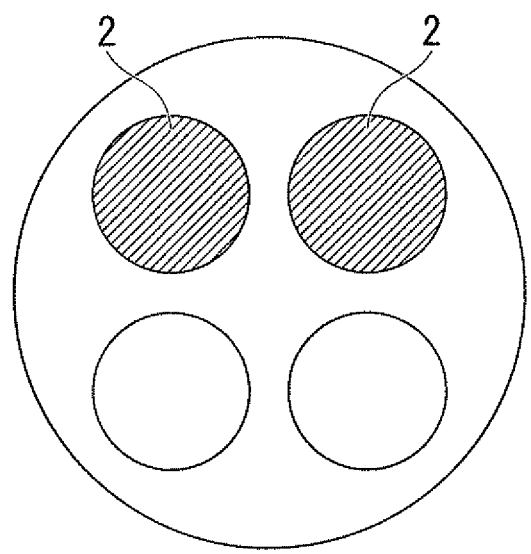
FIG. 5B is a planar schematic diagram of the sputtering apparatus show in FIG. 5B.

Furthermore, on the p-type GaN contact layer 106b, a 250 nm thick IZO film that functioned as the translucent electrode layer 109 was formed by the sputtering method that used the sputtering apparatus shown in FIG. 5A and FIG. 5B (film formation step). In the film formation step, firstly, on the p-type GaN contact layer 106b, the about 2 nm thick translucent electrode layer 109 was formed by the RF sputtering apparatus having two targets 2. Next, the about 250 nm thick translucent electrode layer 109 was formed by the DC sputtering apparatus having two targets 2. During the RF film formation, the pressure was about 1 Pa, and the supplied power was 0.5 kW. During the DC film formation, the Ar gas was introduced, and the pressure thereof was about 0.3 Pa. During the sputtering film formation, the IZO target having the ZnO concentration of 10% by mass was used.

FIG. 5A is a cross-sectional schematic diagram showing the sputtering apparatus used in Example 1, and FIG. 5B is a planar schematic diagram of the sputtering apparatus show in FIG. 5B. This sputtering apparatus included two targets 2 in the chamber (unillustrated) as shown in FIG. 5B, and both of the respective RF and DC sputtering apparatuses had two targets 2. The film formation was performed on the substrate 4 by simultaneously discharging the two targets 2.

Subsequently, the IZO film other than the predetermined region was removed by a photolithography technique. Thereafter, the translucent electrode film was subjected to the heat treatment at 700° C. in the $N_2$ atmosphere (heat treatment step), to form the translucent electrode layer 109.

Thereafter, on the translucent electrode layer 109, a bonding pad structure 107, which had a three-layered structure comprised of a 200 nm thick metal reflective layer 107a formed of Al, a 80 nm thick barrier layer 107b formed of Ti, and a 200 nm thick bonding layer 107c formed of Au, was formed in the region indicated by the reference symbol 107 in FIG. 2 using a photolithography technique.

Next, etching was performed using a photolithography technique, thereby exposing an n-type contact layer in a desired region and an n-type electrode 108 having a two-layered structure made of Ti/Au was formed on this n-type GaN contact layer, and the light extraction surface was regarded as the semiconductor side.

Regarding the semiconductor light-emitting device of Example 1 obtained in the aforementioned manner, the driving voltage (Vf) was measured, and 3.09 V was obtained.

Moreover, the Secondary Ion Mass Spectrometry (SIMS) was used to examine the concentrations of Ga, In, an Zn in the vicinity of the interface 109a between the p-type semiconductor layer 106 and the translucent layer 109 using the expression of the concentrations (atom %) of three atoms. The results are shown in FIG. 7. FIG. 7 is a graph showing the relationship between the concentrations (atom %) of Ga, In, and Zn and the distance from the interface between the p-type semiconductor layer and the translucent electrode layer in the semiconductor light-emitting device of Example 1.

As shown in FIG. 7, in the semiconductor light-emitting device of Example 1, the content of the Zn, which was the dopant element within the translucent electrode layer, decreased gradually toward the interface. Moreover, it was found that Ga, which was the element constituting the p-type semiconductor layer, was diffused from the interface toward the inside of the translucent electrode layer, so as to form the diffusion region in the translucent electrode layer. Moreover, it was found that Ga of 2% or higher was contained even at the position which was 10 nm apart from the interface, and that the diffusion region had a thickness of 5 nm or more from the interface. Moreover, it was found that the content of Zn within the diffusion region was lower than 20 atom % that was the average concentration in the overall translucent electrode layer.

In addition, in the semiconductor light-emitting device of Example 1, Zn was diffused from the interface between the p-type semiconductor layer and the translucent electrode layer toward the inside of the translucent electrode layer. Moreover, the concentration of Zn that was diffused within the p-type semiconductor layer was lower than the lowest concentration of Zn within the translucent electrode layer.

Comparative Example

Figure 6A:
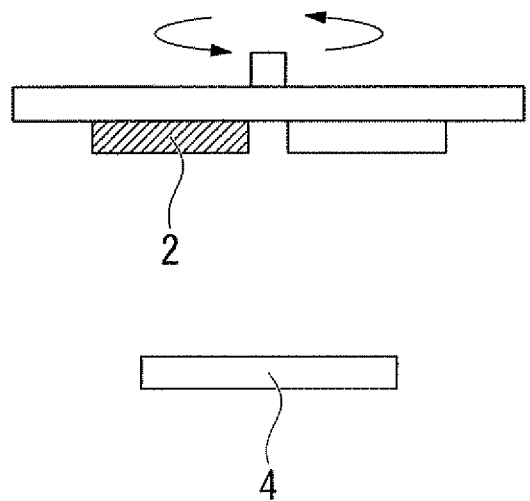
FIG. 6A is a cross-sectional schematic diagram showing the sputtering apparatus used in Comparative Example.
Figure 6B:
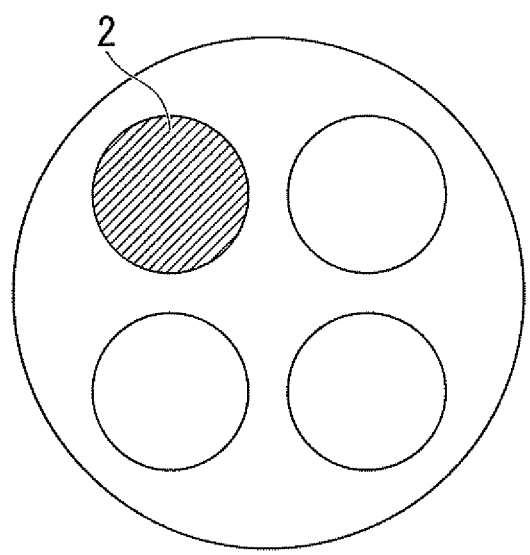
FIG. 6B is a planar schematic diagram of the sputtering apparatus show in FIG. 6B.

The semiconductor light-emitting device of Comparative Example was obtained in the same manner as in Example 1 except that the IZO film that functioned as the translucent electrode layer 109 was formed by the sputtering method that used the sputtering apparatus shown in FIG. 6A and FIG. 6B while the each target was one during the RF sputtering and the DC sputtering. The average concentration of ZnO within the overall IZO film was 20% by mass.

FIG. 6A is a cross-sectional schematic diagram showing the sputtering apparatus used in Comparative Example, and FIG. 6B is a planar schematic diagram of the sputtering apparatus show in FIG. 6B. This sputtering apparatus included one target 2 in the chamber (unillustrated) as shown in FIG. 6B, and the film formation was performed on the substrate 4 by discharging the one target 2. The sputtering conditions were same as in Example 1.

Regarding the semiconductor light-emitting device of Comparative Example obtained in the aforementioned manner, the driving voltage (Vf) was measured, and 3.39 V was obtained.

Figure 8:
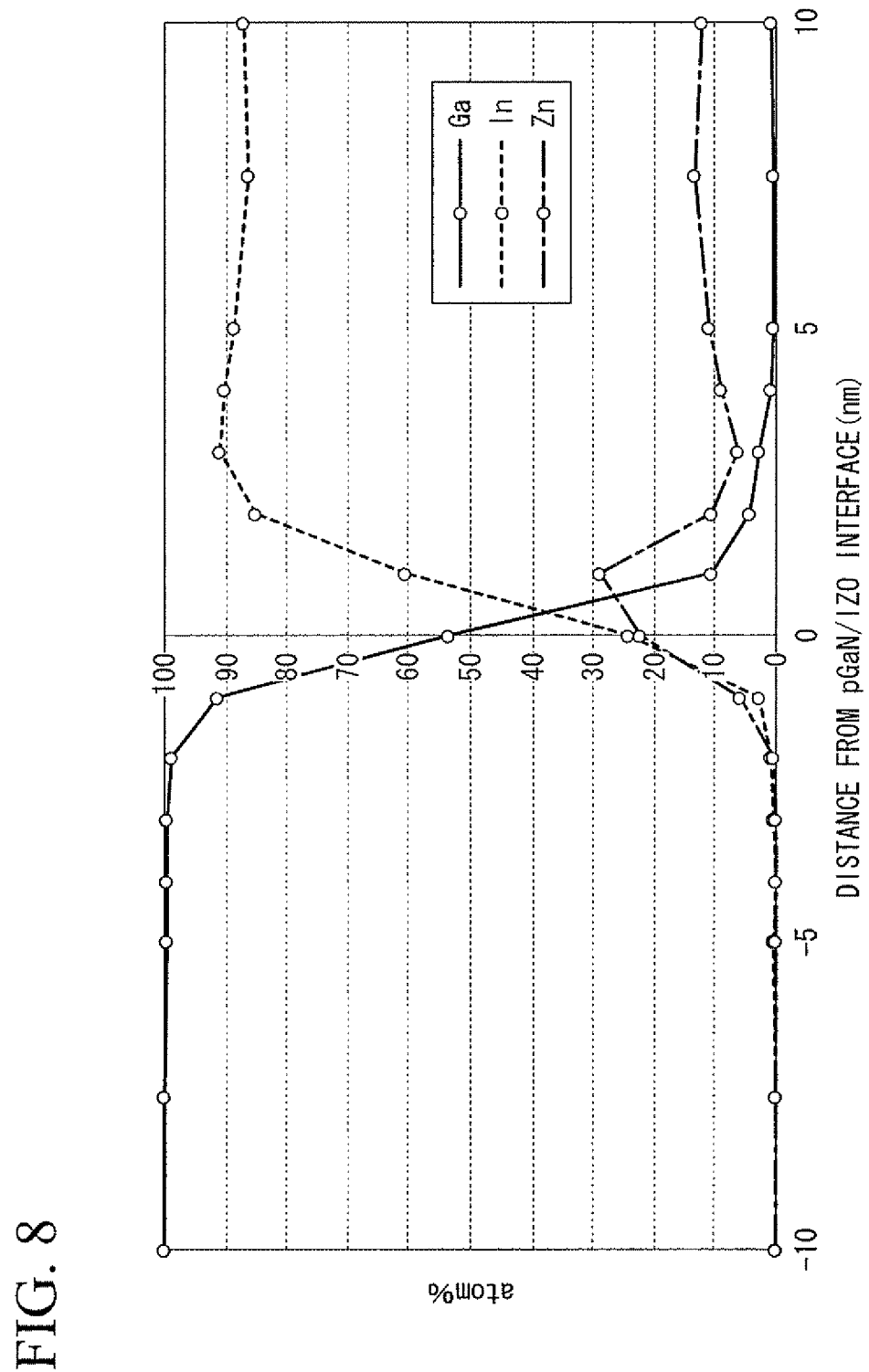
FIG. 8 is a graph showing the relationship between the concentrations (% by mass) of Ga, In, and Zn and the distance from the interface between the p-type semiconductor layer and the translucent electrode layer in the semiconductor light-emitting device of Comparative Examples.

Moreover, the Secondary Ion Mass Spectrometry (SIMS) was used to examine the concentrations of Ga, In, an Zn in the vicinity of the interface 109a between the p-type semiconductor layer 106 and the translucent layer 109 using the expression of the concentrations (atom %) of three atoms. The results are shown in FIG. 8. FIG. 8 is a graph showing the relationship between the concentrations (atom %) of Ga, In, and Zn and the distance from the interface between the p-type semiconductor layer and the translucent electrode layer in the semiconductor light-emitting device of Comparative Example.

As shown in FIG. 8, in the semiconductor light-emitting device of Comparative Example, the content of the Zn, which was the dopant element within the translucent electrode layer, at the position that was 1 nm apart from the interface was higher than the concentration at the interface, and the concentration at the position that was 3 nm apart from the interface was the lowest in the translucent electrode layer. Moreover, it was found that Ga, which was the element constituting the p-type semiconductor layer, was diffused from the interface toward the inside of the translucent electrode layer even in the semiconductor light-emitting device of Comparative Example, so as to form the diffusion region in the translucent electrode layer. However, in the semiconductor light-emitting device of Comparative Example, unlike Example 1, Ga was hardly contained at the position which was 5 nm apart from the interface, and the concentration of Ga was 2% or lower at the position which was 10 nm apart from the interface. Moreover, in the semiconductor light-emitting device of Comparative Example, there existed the region, where the Zn content was higher than that in the periphery (the peak of the concentration), in the vicinity of the interface within the translucent electrode layer, i.e. the diffusion region (at the position that was 1 nm apart from the interface). In this region, there existed the portion whose Zn content was higher than 20 atom % that was the average concentration in the overall translucent electrode layer.

In addition, in the semiconductor light-emitting device of Comparative Example, Zn was diffused from the interface between the p-type semiconductor layer and the translucent electrode layer toward the inside of the translucent electrode layer. Moreover, in the p-type semiconductor layer, there existed the portion having the Zn concentration that was higher than at the position 3 nm apart from the interface where the Zn concentration was the lowest in the translucent electrode layer (the region from the interface to the position 0.5 nm apart toward the inside of the p-type semiconductor layer).

Example 2

The lamp equipped with the semiconductor light-emitting device was able to be manufactured using the semiconductor light-emitting device manufactured in Example 1 according to the method disclosed in Japanese Unexamined Patent Application, First Publication No. 2007-194401. The backlight equipped with the lamp was able to be manufactured as one example of the electrical devices and the mechanical devices.

REFERENCE SIGNS LIST

1: Semiconductor light-emitting device
20: Laminate semiconductor layer
101: Substrate
104: n-type semiconductor layer
105: Light-emitting layer
106: p-type semiconductor layer
106a: Top surface
107: Bonding pad electrode
107a: Metal reflective layer
107b: Barrier layer
107c: Bonding layer
108: n-type electrode
109: Translucent electrode layer
109a: Interface
109b: Diffusion region

The invention claimed is:

1. A semiconductor light-emitting device comprising:
a substrate;
a laminate semiconductor layer formed by sequentially laminating an n-type semiconductor layer, a light-emitting layer, and a p-type semiconductor layer on the substrate; and
a translucent electrode layer formed on a top surface of the p-type semiconductor layer, wherein
the translucent electrode layer contains Zn as a dopant element,
a content of the Zn within the translucent electrode layer decreases gradually toward the interface between the p-type semiconductor layer and the translucent electrode layer, and
in the translucent electrode layer is formed a diffusion region in which an element constituting the p-type semiconductor layer is diffused from the interface toward the inside of the translucent electrode layer.

2. The semiconductor light-emitting device according to claim 1, wherein a concentration of an element constituting the p-type semiconductor layer is 2 atom % or higher at the position 5 nm apart from the interface in the diffusion region.

3. The semiconductor light-emitting device according to claim 1, wherein the diffusion region has a thickness of 3 nm or more from the interface.

4. The semiconductor light-emitting device according to claim 1, wherein the diffusion region has a thickness of 5 nm or more from the interface.

5. The semiconductor light-emitting device according to claim 1, wherein a content of the dopant element within the diffusion region is lower than an average concentration of the dopant element in the overall translucent electrode layer.

6. The semiconductor light-emitting device according to claim 1, wherein the p-type semiconductor layer contains GaN.

7. The semiconductor light-emitting device according to claim 1, wherein the translucent electrode layer contains an oxide of at least one metal selected from the group consisting of In, Sn, Zn, Al, Ga, Ti, and Ce.

8. The semiconductor light-emitting device according to claim 1, wherein the translucent electrode layer is formed of IZO.

9. A method for manufacturing the semiconductor light-emitting device as claimed in claim 1, comprising the steps of:
forming a laminate semiconductor layer by sequentially laminating an n-type semiconductor layer, a light-emitting layer, and a p-type semiconductor layer on the substrate; and
forming a translucent electrode layer containing Zn on a top surface of the p-type semiconductor layer, wherein
the step of forming the translucent electrode layer comprises a film formation step, in which a translucent electrode film is formed by a sputtering method, and a heat treatment step in which a heat treatment is performed at 300° C. to 800° C. after the film formation step.

10. A method for manufacturing the semiconductor light-emitting device as claimed in claim 1, which comprises the steps of:
forming a laminate semiconductor layer by sequentially laminating an n-type semiconductor layer, a light-emitting layer, and a p-type semiconductor layer on the substrate; and
forming a translucent electrode layer containing Zn on a top surface of the p-type semiconductor layer, wherein
the step of forming the translucent electrode layer comprises a film formation step, in which a translucent electrode film is formed by a sputtering method, and a heat treatment step in which a heat treatment is performed at 300° C. to 800° C. after the film formation step, and
the film formation step, in which the translucent electrode film is formed by the sputtering method, comprises a step in which the translucent electrode layer is formed by an RF sputtering and a DC sputtering and at least one of the RF sputtering and the DC sputtering comprises two targets.

11. A lamp comprising the semiconductor light-emitting device as claimed in claim 1, first and second frames, and a mold made of transparent resin, wherein
the semiconductor light-emitting device is electrically connected to the first and second frames, and
the semiconductor light-emitting device and a part of each of the first and second frames are sealed with the mold.

12. An electronic device comprising the lamp according to claim 11.

13. A mechanical device comprising the electronic device according to claim 12.

* * * * *